United States Patent
Leamy et al.

(10) Patent No.: US 12,267,066 B2
(45) Date of Patent: Apr. 1, 2025

(54) TOPOLOGICAL INSULATOR-BASED MULTIPLEXER/DEMULTIPLEXER

(71) Applicant: Georgia Tech Research Corporation, Atlanta, GA (US)

(72) Inventors: Michael J. Leamy, Atlanta, GA (US); Amir A. Darabi, Atlanta, GA (US); Emily Kliewer, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 269 days.

(21) Appl. No.: 17/935,694

(22) Filed: Sep. 27, 2022

(65) Prior Publication Data
US 2023/0101350 A1   Mar. 30, 2023

Related U.S. Application Data

(60) Provisional application No. 63/248,552, filed on Sep. 27, 2021.

(51) Int. Cl.
*H03H 9/72* (2006.01)
*H10N 30/80* (2023.01)

(52) U.S. Cl.
CPC ............ *H03H 9/72* (2013.01); *H10N 30/802* (2023.02)

(58) Field of Classification Search
CPC ........ H03H 9/72; H10N 30/802; H10N 39/00; H03K 17/81
USPC .................................................. 333/132, 133
See application file for complete search history.

(56) References Cited

PUBLICATIONS

Darabi et al. "Experimental Realization of a Reconfigurable Electroacoustic Topological Insulator", PNAS Published on Jul. 14, 2020 (Year: 2020).*

* cited by examiner

*Primary Examiner* — Jorge L Salazar, Jr.
(74) *Attorney, Agent, or Firm* — Troutman Pepper Hamilton Sanders LLP; Ryan A. Schneider; Dustin B. Weeks (57) ABSTRACT

An exemplary embodiment of the present disclosure provides a multiplexer/demultiplexer, comprising a plurality of unit cells arranged in a lattice, a first domain, a second domain, a third domain, and a controller. Each of the unit cells can comprise a topological-insulative material, a first piezoelectric patch, and a second piezoelectric patch. A first domain can comprise a first portion of the plurality of unit cells. A second domain can comprise a second portion of the plurality of unit cells. A third domain can comprise a third portion of the plurality of unit cells. The controller can be configured to: apply a negative capacitance to the first piezoelectric patches in the first domain; apply a negative capacitance to the second piezoelectric patches in the second domain; and alternately apply a negative capacitance to the first and second piezoelectric patches, respectively, in the third domain.

19 Claims, 5 Drawing Sheets

TOPOLOGICAL INSULATOR-BASED MULTIPLEXER/DEMULTIPLEXER

CROSS-REFERENCE TO RELATED APPLICATIONS

This application claims the benefit of U.S. Provisional Application Ser. No. 63/248,552, filed on 27 Sep. 2021, which is incorporated herein by reference in its entirety as if fully set forth below.

GOVERNMENT LICENSE RIGHTS

This invention was made with government support under Agreement No. 1929849, awarded by the National Science Foundation. The government has certain rights in the invention.

FIELD OF THE DISCLOSURE

The various embodiments of the present disclosure relate generally to multiplexers and demultiplexers, and more particularly to topological insulator-based multiplexers and demultiplexers.

BACKGROUND

The challenge of propagating lossless information has been readdressed in recent years through introduction of topological insulators ("Tis") supporting topologically protected states. These advantageous states, induced by quantum Hall and quantum spin Hall effects, or their analogs, originated from electronic materials using Fermi-Dirac statistics and then appeared in classical waves in electromagnetic systems and most recently in phononic systems. These structures have a unique potential to protect propagating waves against backscattering in the presence of sharp edges, disorder, and defects over broad frequency ranges.

Recently, mechanical TIs have been explored to control phonons in statical states or dynamical waves with minimal diffraction losses. As compared to photonic systems at the same excitation frequency, mechanical systems have the benefit of operating at smaller wavelengths with stronger boson-boson interactions. Mechanical TIs can be categorized into two main quantum-analogous groups. The first group mimics the quantum Hall effect ("QHE") by breaking time-reversal symmetry in any of a number of demonstrated ways, such as employing Lorentz forces, gyroscopes or rotating frames, or spatiotemporal control of material properties (e.g., elasticity). The second group mimics the quantum spin Hall effect ("QSHE") by breaking the inversion symmetry in a passive manner, featuring both forward and backward propagating edge modes, without the need of external energy input. These passive devices have been explored numerically and tested experimentally for both discrete systems composed of masses and springs and elastic waves propagating in thin plates. However, due to the need for pairs of coincident Dirac cones in QSHE, complexities arise in designing and fabricating a functional QSHE-based TI. To address this issue, TIs based on the quantum valley Hall effect ("QVHE") have recently been introduced, which break inversion symmetry in a simpler fashion, requiring only one set of degenerate Dirac cones. Similar to other types of TIs, QVHE has been extended to phononic systems to demonstrate valley interface states by utilizing: (i) anisotropic scatterers in sonic crystals, (ii) arrays of resonators or different inclusion types in thin plates, and (iii) shunted piezoelectric patches with external negative capacitance.

In order to realize the full potential of mechanical topological insulators in commercial applications, however, it is highly desirable that they be reconfigurable and programmable such that guided waves propagate along dynamic pathways with minimal diffraction loss. Recently, the inventors of the present disclosure proposed and experimentally tested a programmable electroacoustic TI in which a thin plate supports a periodic array of switched piezoelectric (PZT) patches connected to negative capacitance circuits. By employing two PZTs per unit cell and switching on one or the other (yielding material A and B type, respectively), dramatic stiffness changes local to the PZT can be introduced, which in turn breaks inversion symmetry. Topological states then exist anytime the two material types form an interface.

There is a need, however, for improved multiplexers and demultiplexers which build upon and incorporate Tis.

BRIEF SUMMARY

An exemplary embodiment of the present disclosure provides a multiplexer/demultiplexer, comprising a plurality of unit cells, a first domain, a second domain, a third domain, and a controller. The plurality of unit cells can be arranged in a lattice. Each of the unit cells can comprise a topological-insulative material, a first piezoelectric patch, and a second piezoelectric patch. A first domain can comprise a first portion of the plurality of unit cells. A second domain can comprise a second portion of the plurality of unit cells. A third domain can comprise a third portion of the plurality of unit cells. The controller can be configured to: apply a negative capacitance to the first piezoelectric patches in the first portion of the plurality of unit cells; apply a negative capacitance to the second piezoelectric patches in the second portion of the plurality of unit cells; and alternately apply a negative capacitance to the first and second piezoelectric patches, respectively, in the third portion of the plurality unit of cells.

In any of the embodiments disclosed herein, the multiplexer/demultiplexer can comprise a first acoustic wave port, a second acoustic wave port, and a third acoustic wave port. The first acoustic wave port can be positioned at an interface of the first domain and the second domain proximate an edge of the lattice. The first acoustic wave port can be configured to transmit an acoustic wave to and/or receive an acoustic wave from the lattice. The second acoustic wave port can be positioned at an interface of the first domain and the third domain proximate an edge of the lattice. The first acoustic wave port can be configured to transmit an acoustic wave to and/or receive an acoustic wave from the lattice. The third acoustic wave port can be positioned at an interface of the second domain and the third domain proximate an edge of the lattice. The first acoustic wave port can be configured to transmit an acoustic wave to and/or receive an acoustic wave from the lattice.

In any of the embodiments disclosed herein, the multiplexer/demultiplexer can be configured such that when the controller applies a negative capacitance to the first piezoelectric patches in the first and third portions of the plurality of unit cells and the second piezoelectric patches in the second portion of the plurality of unit cells, acoustic waves propagate between the first acoustic wave port and the third acoustic wave port along topological domain walls.

In any of the embodiments disclosed herein, the multiplexer/demultiplexer can be configured such that when the controller applies a negative capacitance to the first piezoelectric patches in the first portion of the plurality of unit cells and the second piezoelectric patches in the second and third portions of the plurality of unit cells, acoustic waves propagate between the first acoustic wave port and the second acoustic wave port along topological domain walls.

In any of the embodiments disclosed herein, the first acoustic wave port can be an input and the second and third acoustic wave ports can be outputs, such that the multiplexer/demultiplexer is configured as a demultiplexer.

In any of the embodiments disclosed herein, the first acoustic wave port can be an output and the second and third acoustic wave ports can be inputs, such that the multiplexer/demultiplexer is configured as a multiplexer.

In any of the embodiments disclosed herein, each of the unit cells can be configured such that application of negative capacitance to one of the first and second piezoelectric patches causes a break in inversion symmetry of the respective unit cell.

In any of the embodiments disclosed herein, the controller can comprise a negative capacitance circuit comprising, an operational amplifier, a first resistor, a second resistor in series with the first resistor, and a capacitor.

In any of the embodiments disclosed herein, the lattice can have a hexagonal shape.

In any of the embodiments disclosed herein, interfaces between the first, second, and third domains can be separated by an angle of about 120 degrees.

Another embodiment provides a multiplexer/demultiplexer, comprising: a plurality of unit cells and a controller. The plurality of unit cells can be arranged in a lattice. Each of the unit cells can comprise a topological-insulative material, a first piezoelectric patch, and a second piezoelectric patch. The controller can be configured to selectively apply a negative capacitance to the first and/or second piezoelectric patches of the plurality of unit cells to control the propagation of a wave through the lattice.

In any of the embodiments disclosed herein, the plurality of unit cells can be divided into a first domain, a second domain, and a third domain, the controller can be configured to apply a negative capacitance to the first piezoelectric patches in the first domain and the second piezoelectric patches in the second domain, and the controller can be further configured to alternately apply a negative capacitance to the first and second piezoelectric switches, respectively, of the third domain.

In any of the embodiments disclosed herein, the multiplexer/demultiplexer can further comprise a first port positioned at an interface between the first and second domains, a second port positioned at an interface between the first and third domains, and a third port positioned at an interface between the second and third domains.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

DETAILED DESCRIPTION

To facilitate an understanding of the principles and features of the present disclosure, various illustrative embodiments are explained below. The components, steps, and materials described hereinafter as making up various elements of the embodiments disclosed herein are intended to be illustrative and not restrictive. Many suitable components, steps, and materials that would perform the same or similar functions as the components, steps, and materials described herein are intended to be embraced within the scope of the disclosure. Such other components, steps, and materials not described herein can include, but are not limited to, similar components or steps that are developed after development of the embodiments disclosed herein.

Some of the embodiments disclosed herein build upon the electroacoustic system introduced in Darabi et al., "Experimental realization of a reconfigurable electroacoustic topological insulator," Prox. Natl. Acad. Sci. U.S.A. 117, 16138 (2020). In particular, embodiments disclosed herein provide the first TI-based mechanical multiplexer/demultiplexer, where the topological interfaces used for propagating waves can alternate in real time simply by controlling the PZT switches. This can be achieved by adding a controller to the setup, which opens and closes switches connecting the PZTs to the external circuits. A spatial implementation of multiplexing on a fixed frequency, which is commonly termed "time-division multiplexing," can be used. The definition of multiplexing used herein differs from "frequency-division multiplexing," which uses multiple frequency bands to multiplex over a single channel. Here, waves can be guided from input(s) to output(s) with minimal loss and topological protection from backscattering. The mechanical multiplexers/demultiplexers disclosed herein can assist in mechanical channeling of information to complement widely used mechanical filters (e.g., SAW devices) in communication devices, radios, and computer peripherals.

Figure 1A:
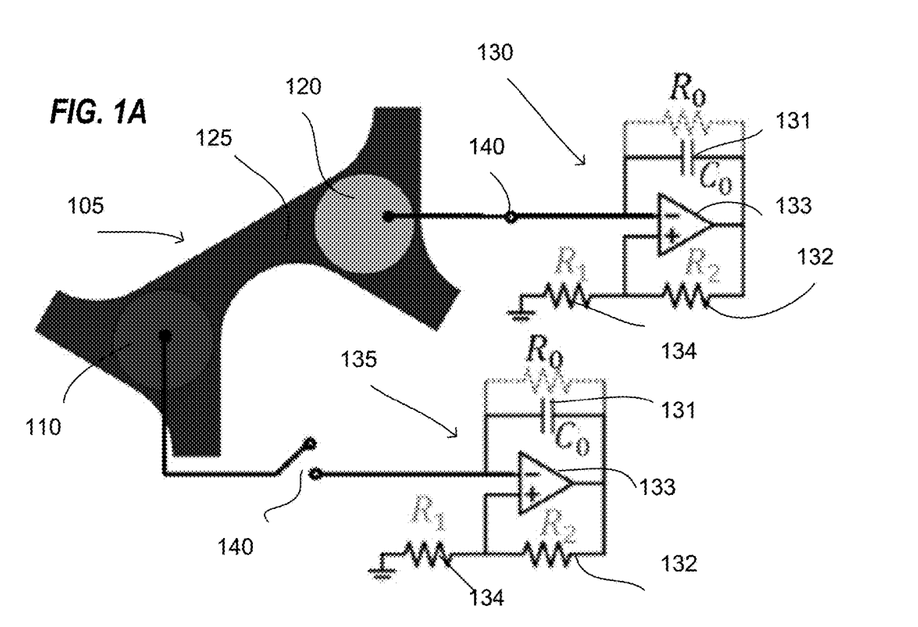
FIG. 1A provides a unit cell for a multiplexer/demultiplexer, in accordance with an exemplary embodiment of the present disclosure.

An exemplary embodiment of the present disclosure provides a multiplexer/demultiplexer comprising a plurality of unit cells 105. As shown in FIG. 1A, each of the unit cells 105 can be made of a topological-insulative material 125. The topological-insulative material 125 can be many topological-insulative materials known in the art. In some embodiments, the topological-insulative material 125 comprises aluminum, polymers, or combinations thereof. The unit cells 105 can also have many different shapes. As shown in FIG. 1A, the unit cell 105 can have a triangular shape.

Each of the unit cells 105 can further comprise a first piezoelectric patch (PZT) 110 and a second PZT 120. The first 110 and second 120 PZTs can be electrically coupled to one or more negative capacitance circuits 130, 135. As shown in FIG. 1A, the negative capacitance circuits 130, 135 can comprise an operational amplifier 133, first 132 and second 134 resistors, and a capacitor 131. In some embodiments, as shown in FIG. 1A, the first resistor 132 can be in series with the second resistor 134. When no negative capacitance is applied to either the first 110 or second 120 PZTs, the unit cells 105 can support Dirac points. Applying a negative capacitance to either the first 110 or second 120 PZTs, however, can break inversion symmetry, in turn creating a bandgap located at the original Dirac point and supporting topologically protected states.

Figure 2A:
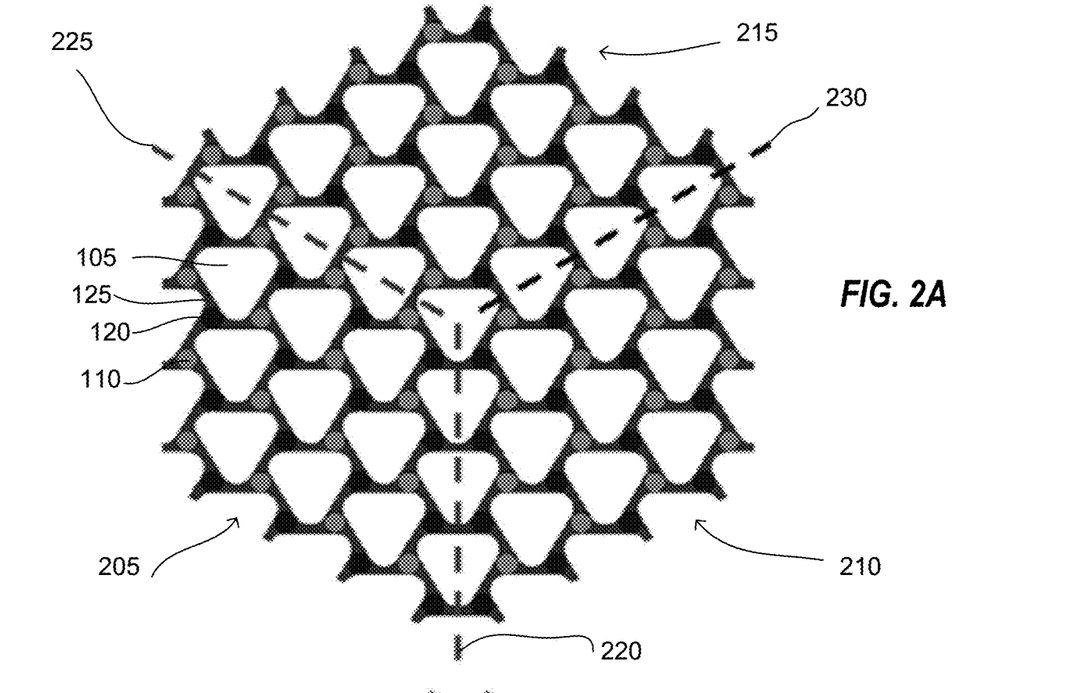
FIGS. 2A-B provide schematics of an exemplary multiplexer/demultiplexer, in accordance with an exemplary embodiment of the present disclosure.
Figure 2B:
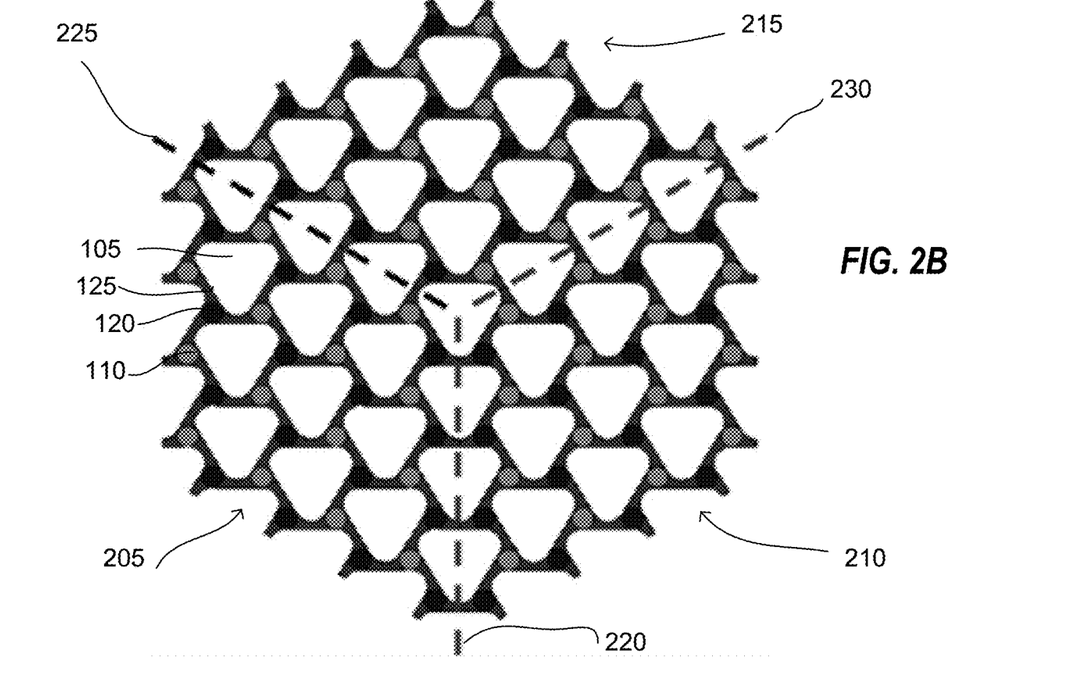

The plurality of unit cells 105 can be arranged periodically in a lattice. The lattice can have many shapes in accordance with various embodiments of the present disclosure. For example, as shown in FIGS. 2A-B, the lattice can have a hexagonal shape. The plurality of unit cells 105 in the lattice can be divided into a plurality of domains. For example, as shown in FIGS. 2A-B, the plurality of unit cells can be divided into a first domain 205, a second domain 215, and a third domain 220. As shown in FIGS. 2A-B, the first 205, second 210, and third 215 domains, can be separated by about 120 degrees.

Figure 3A:
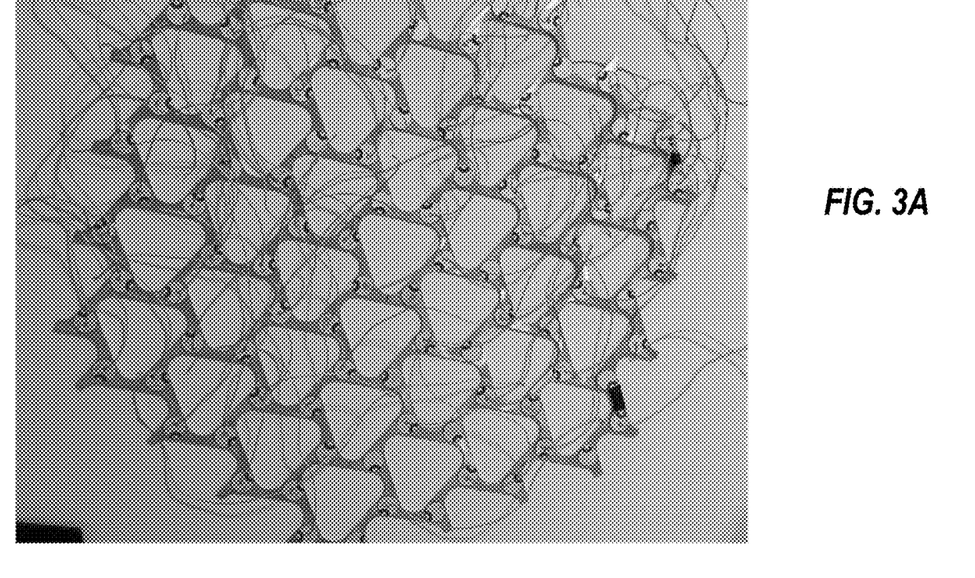
FIGS. 3A-B provide photographs of an exemplary multiplexer/demultiplexer, in accordance with an exemplary embodiment of the present disclosure.
Figure 3B:
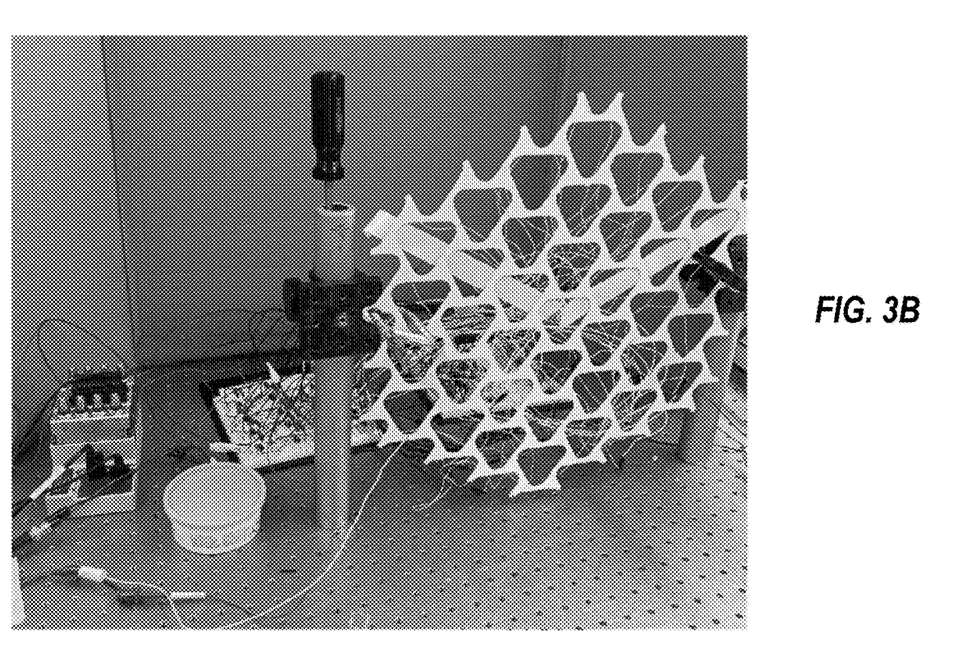

The demultiplexer/multiplexer can further comprise a controller (shown in FIG. 3B). The controller can be many controllers known in the art, including, but not limited to, microcontrollers, CPUs, switching circuits, and the like. The controller can be configured to apply a negative capacitance to the first 110 and/or second 120 PZTs of each of the unit cells 105. In some embodiments, the controller can apply a negative capacitance to the first 110 and/or second 120 PZTs by closing a switch 140 between the negative capacitance circuits 130, 135 and the first 110 and second 120 PZTs. For example, the controller can be configured to apply a negative capacitance, e.g., from the negative capacitance circuit 130, 135, to first PZTs 110 in the unit cells 105 in the first domain 205 and the second PZTs 120 in the second domain 210. Further, to provide for the multiplexer/demultiplexer functionality, the controller can be configured to alternately apply a negative capacitance to the first 110 and second 120 PZTs respectively, in the unit cells 105 in the third domain 215.

Ports can be provided at the interfaces between the various domains. For example, as shown in FIGS. 2A-B, a first port 220 can be positioned at an interface of the first domain 205 and the second domain 210 proximate an edge of the lattice, a second port 225 can be positioned at an interface of the first domain 205 and the third domain 215 proximate an edge of the lattice, and a third port 230 can be positioned at an interface of the second domain 210 and the third domain 215 proximate an edge of the lattice. By controlling the first 110 and second 120 PZTs in unit cells 105 in the third domain 215, the controller can control the propagation of waves between the first port 220 and the second 225 and third 230 ports. For example, when the controller applies a negative capacitance to the first PZTs 110 in the second 210 and third 215 domains and the second PZTs 120 in the first domain 205, waves (e.g., acoustic waves) can propagate between the first port 220 and the second port 225 along topological domain walls, as shown in FIG. 2A. Similarly, when the controller applies a negative capacitance to the first PZTs 110 in the first 205 and third 215 domains and the second PZTs 120 in the second domain 210, waves (e.g., acoustic waves) can propagate between the first port 220 and the third port 230 along topological domain walls, as shown in FIG. 2B.

The systems disclosed herein can function as either a multiplexer or a demultiplexer. For example, in some embodiments, the first port 220 can be an input and the second 225 and third 230 ports can be outputs, such that the multiplexer/demultiplexer is configured as a demultiplexer. Similarly, in some embodiments, the first port 220 can be an output and the second 225 and third 230 ports can be inputs, such that the multiplexer/demultiplexer is configured as a multiplexer.

EXAMPLES

Various exemplary embodiments of the present disclosure will now be described. It should be noted, however, these embodiments are exemplary only and in no way limit the scope of the present disclosure.

FIG. 1A depicts a 1 mm thick graphene-like unit cell 105, which comprises an aluminum plate 125 and two shunted PZTs 110 120 having diameter and thickness of 15 and 0.7 mm, respectively. Each PZT disk 110 120 connects to a circuit 130 135 (also shown in FIG. 9A) with an equivalent negative capacitance through an external ON/OFF switch 140. These circuits 130 135 are composed of an operational amplifier (op-amp) 133, two resistors 132 134 connected in series ($R_1=100\Omega$, $R_2=150\Omega$), and one capacitor ($C_0=1.7$ nF) 131 to provide a negative capacitance of $C_{neg}=-C_0R_2/R_1$. These unit cells 105 were then periodically repeated in the lattice directions to form the proposed structure. Solid lines in FIG. 2B represent the band structure of this unit cell 105 when both of PZT disks 110 120 experience open circuit conditions (i.e., both switches 140 are off). As illustrated, two connected Dirac cones present at the K point (at approximately f=46 kHz), where two of the bands cross transversely.

Figure 1B:
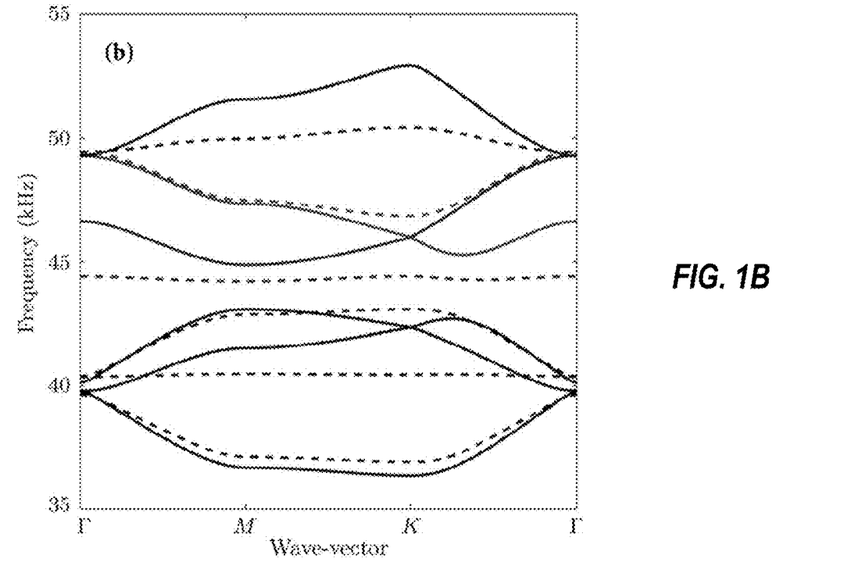
FIG. 1B provides a plot of the band structure of the unit cell shown in FIG. 1A when both PZT disks experience open circuit conditions.

Setting one of the PZT switches 140 to ON, with the other one OFF, breaks inversion symmetry in the unit cell 105 and separates the folded Dirac cones for the frequency range of interest (40-50 kHz for this study). This connects the PZT 110 120 to the external negative capacitance circuit 130 135, which provides a significant change in the elastic modulus of the disk. The band structure of the broken symmetry unit cell is plotted in FIG. 1B as dashed lines, documenting a clear topological bandgap (bounded with the dashed lines), at the location of the original Dirac point, extending from approximately 44-48 kHz. Each band surrounding the bandgap has a valley Chern number of $\pm\frac{1}{2}$, providing the total Chern number of ($|\Delta C_v|=1$) at the intersection of two sub-structures with opposite circuit conditions.

A particularly intriguing property of topological insulators is their ability to guide waves along sharp-edged trajectories free of backscattering and with minimal loss. For mechanical systems, this unique behavior has significant implications for designing acoustic multiplexing and demultiplexing devices to complement, for example, mechanical filters in communication-based devices. Such devices can be configured next using the electroacoustic material described above.

FIGS. 2A-B provides an exemplary system comprising three subdomains 205 210 215, each with sixteen-unit cells 105 periodically repeated in the two lattice directions. The subdomain interfaces are separated by an angle of 120 degrees, which is convenient for getting the largest separation of the signals. For the first subdomain 205, the disks on the lower half of the unit cells are always shunted and the rest are disconnected, while for the second subdomain 210, the disks on the upper half of the unit cell are always shunted and the rest are disconnected. This creates a topological interface between these two subdomains (marked with vertical dashed line) supporting backscattering immune interface waves at a frequency within the topological bandgap. On the contrary, for the third subdomain 215, all the disks are shunted to external circuits, but only half of the connecting switches are ON, and the other half are OFF. Therefore, the symmetry condition of the third domain 215 can alternate between experiencing the same condition as either the first subdomain 205 or the second subdomain 210, yielding dynamic interfaces connecting either the top-left port 225 to the bottom port 220 (see FIG. 2A) or the top-right port 230 to the bottom port 220 (see FIG. 2B). This then enables multiplexing in which two input ports 225 230 (i.e., top-left and top-right) channel information to a single output port 220 (i.e., bottom) or demultiplexing in which one input port 220 (i.e., bottom) channels information to two output ports 225 230 (i.e., top-left and top-right).

The above-described operation can employ 32 controllable single-pole switches, or 16 controllable double-pole switches, to alternate the third domain 215 between the two requisite symmetry types. In practical implementation, since an unpowered op-amp acts as on open switch, two controllable single-pole switches (or one controllable double-pole switch) can be used if each switch is used to power ON/OFF all of the op-amps associated with the top and bottom unit cell PZTs, respectively. No physical switches are then needed between the PZTs and the shunted circuits. This is the strategy pursued in the experiments described next.

FIGS. 3A-B provide photographs of the fabricated structure (FIG. 4A) and the external circuit/controller (FIG. 3B). This structure can be realized by machining a 1 mm thickness aluminum plate (E=70 GPa, p=2700 kg/m$^3$; v=0.33) and bonding (using 3M DP270 Epoxy Adhesive) 96 piezoelectric disks. Each piezoelectric disk has a 15 mm diameter and a 0.7 mm thickness. For each circuit wired to the PZT disk, negative capacitance $C_0$=2:55 nF is obtained by using $R_1$=100Ω; $R_2$=150Ω, $C_0$=1.7 nF, and $R_0$=1 MΩ. A Polytec PSV-400 scanning laser Doppler vibrometer measures the resulting out-of-plane wavefield velocity using the backside of the aluminum plate, repeating and averaging each measurement 10 times (in order to reduce the influence of noise). In order to generate waves into the system, one of the bonded piezoelectric disks is connected to a 150 mV (peak-to-peak) burst sinusoidal signal, using a function generator (Agilent 33220A) coupled to a voltage amplifier (B&K1040L). Finally, in order to decrease the boundary effects at the location of the source, absorbing patches are used to reduce the leakage of propagation waves on the edge. In order to find the bandgap experimentally, first one point falling on the intended interface between two opposite domains is considered. While all the OP-AMPs are off (i.e., the PZTs are not connected to a negative capacitance circuit), a frequency sweep for the response of the system at the considered point is performed. For this condition, all the interfaces disappear (no symmetry is broken); hence, no bandgaps should be reported. This test is repeated again while the symmetry is broken (by turning ON the corresponding OP-AMPs) in which a new frequency response for a system with a topological bandgap is achieved. By comparing the response of these two tests, the frequency range of interest containing the topological bandgap can be obtained.

Figure 4:
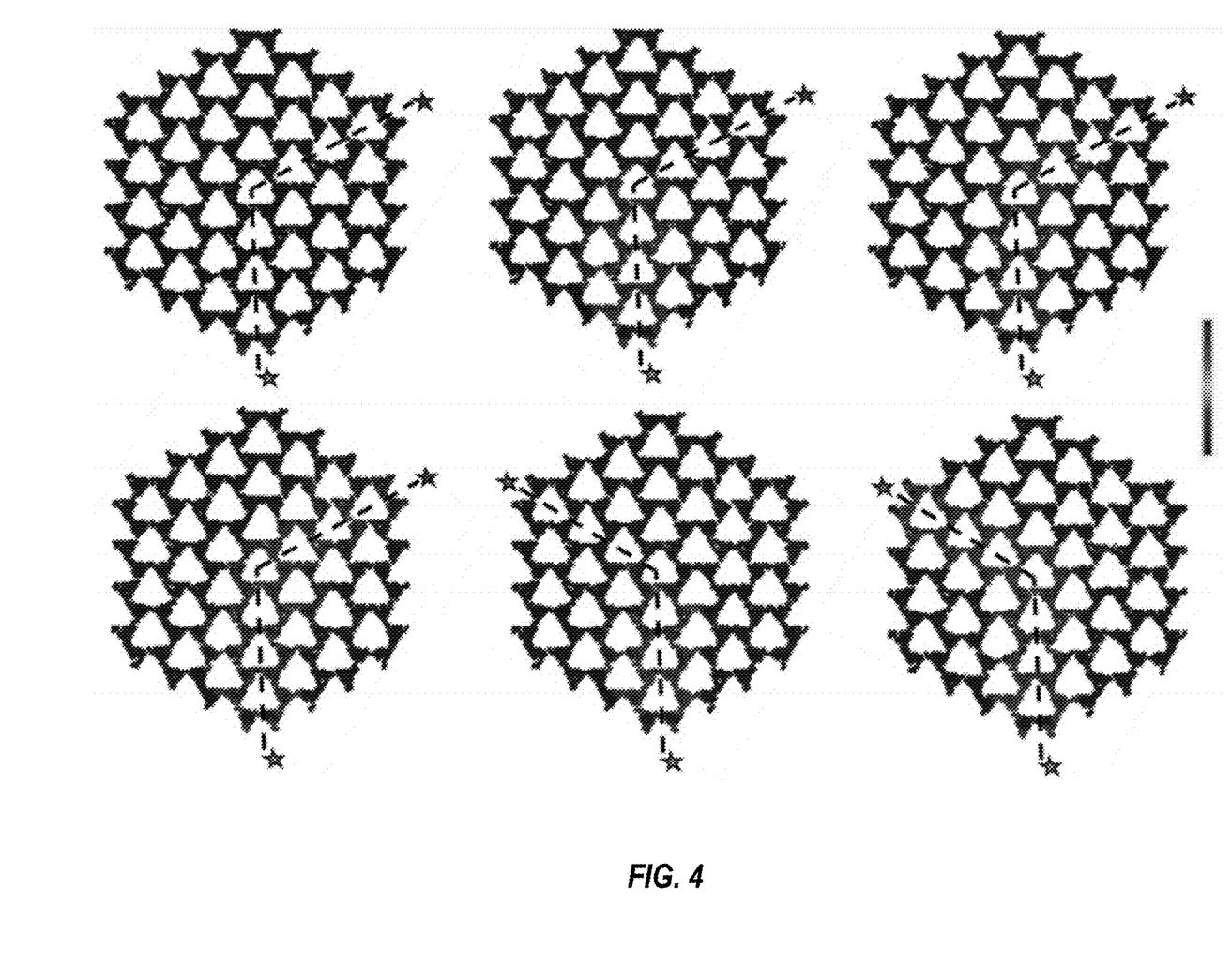
FIG. 4 provides schematics of experimentally characterized demultiplexing operation, in accordance with an exemplary embodiment of the present disclosure.

FIG. 4 displays the full-field response of the system over time for a source located at the bottom of the structure (bottom star). First, the source is used to send sinusoidal signals at 54 kHz while powering half of the op-amps such that the third domain 215 symmetry condition matches subdomain I's. Due to the approximate nature of the computational model, the topological bandgap in the fabricated structure appears at a higher frequency than that predicted by the model. As documented in FIG. 4, the signal propagates from the source to the first receiver (top-right star) along the introduced topological interface connecting separating subdomains I-II and II-III, bending toward the receiver with little to no backscattering. After the intended signal packet reaches the first receiver at t=1.5 ms, the system is paused for 1.5 ms to allow the waves to be fully absorbed, preparing the structure for the second signal packet. Then, at time t=3 ms, an additional ten cycles is sent to the source, this time with the third domain 215 symmetry condition matching the second domain 210. The signal travels along the new interface separating the first 205 and second 210 domains and the first 205 and third 215 domains, reaching the second receiver at the top-left corner at t=4.5 ms. Repeating the operation periodically allows continuous operation in which two multiplexed signals arriving at the same input (and spaced in time) are separated into two channels, effectively demonstrating demultiplexing of information. Reverse operation allows for multiplexing.

Figure 5:
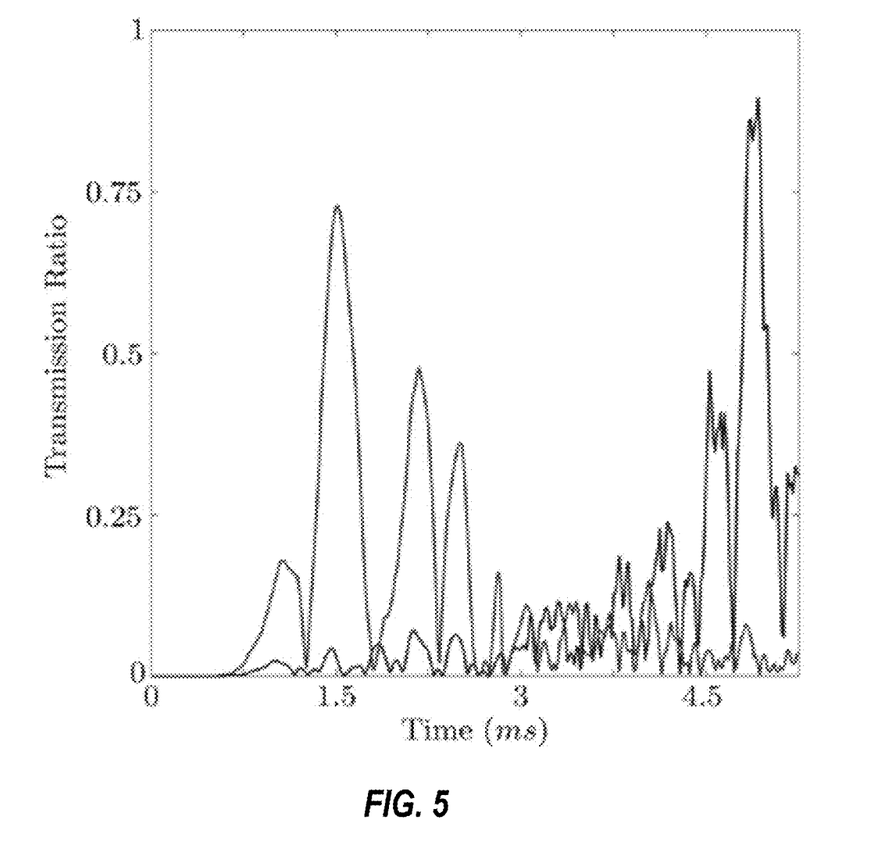
FIG. 5 provides plots of experimentally measured transmission ratio at receivers of an exemplary multiplexer/demultiplexer.

To further illustrate the effectiveness of the demultiplexing device, FIG. 5 provides a plot of the signal transmission ratio as a function of time at both receivers (i.e., both output channels). As documented, the signal amplitude at the first receive reaches its maximum at approximately time t=1.5 ms, with 75 percent of the sending signal amplitude recovered. Similarly, the signal at the second receiver reaches its maximum amplitude (80% of the source signal) at approximately time t=5 ms. Note that the signal strength at the first output channel is minimal when the second output channel signal strength is maximal, and vice versa.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way.

What is claimed is:

1. A multiplexer/demultiplexer comprising:
    unit cells arranged in a lattice, each of the unit cells comprising:
        a topological-insulative material;
        a first piezoelectric patch; and
        a second piezoelectric patch;
    a first domain comprising a first portion of the unit cells;
    a second domain comprising a second portion of the unit cells;
    a third domain comprising a third portion of the unit cells; and
    a controller configured to:
        apply a negative capacitance to the first piezoelectric patches in the first portion of the unit cells;
        apply a negative capacitance to the second piezoelectric patches in the second portion of the unit cells; and
        alternately apply a negative capacitance to the first and second piezoelectric patches, respectively, in the third portion of the unit cells.

2. The multiplexer/demultiplexer of claim 1 further comprising:
    a first acoustic wave port positioned at an interface of the first domain and the second domain proximate a first edge of the lattice, the first acoustic wave port configured to transmit an acoustic wave to and/or receive an acoustic wave from the lattice;
    a second acoustic wave port positioned at an interface of the first domain and the third domain proximate a second edge of the lattice, the first second acoustic wave port configured to transmit an acoustic wave to and/or receive an acoustic wave from the lattice; and
    a third acoustic wave port positioned at an interface of the second domain and the third domain proximate a third edge of the lattice, the first third acoustic wave port configured to transmit an acoustic wave to and/or receive an acoustic wave from the lattice.

3. The multiplexer/demultiplexer of claim 2, wherein the multiplexer/demultiplexer is configured such that when a negative capacitance is applied to the:
    first piezoelectric patches in the first and third portions of the unit cells; and
    the second piezoelectric patches in the second portion of the unit cells;
    acoustic waves propagate between the first acoustic wave port and the third acoustic wave port along topological domain walls.

4. The multiplexer/demultiplexer of claim 2, wherein the multiplexer/demultiplexer is configured such that when a negative capacitance is applied to the:
    first piezoelectric patches in the first portion of the unit cells; and
    the second piezoelectric patches in the second and third portions of the unit cells;
    acoustic waves propagate between the first acoustic wave port and the second acoustic wave port along topological domain walls.

5. The multiplexer/demultiplexer of claim 2, wherein the first acoustic wave port is an input and the second and third acoustic wave ports are outputs, such that the multiplexer/demultiplexer is configured as a demultiplexer.

6. The multiplexer/demultiplexer of claim 2, wherein the first acoustic wave port is an output and the second and third acoustic wave ports are inputs, such that the multiplexer/demultiplexer is configured as a multiplexer.

7. The multiplexer/demultiplexer of claim 2, wherein the interfaces between the first, second, and third domains are separated by an angle of about 120 degrees.

8. The multiplexer/demultiplexer of claim 1, wherein the controller comprises a negative capacitance circuit comprising:
    an operational amplifier;
    a first resistor;
    a second resistor in series with the first resistor; and
    a capacitor.

9. The multiplexer/demultiplexer of claim 1, wherein the lattice has a hexagonal shape.

10. The multiplexer/demultiplexer of claim 1, wherein each of the unit cells is configured such that an application of negative capacitance to one of the first and second piezoelectric patches causes a break in inversion symmetry of the respective unit cell.

11. A multiplexer/demultiplexer comprising:
    a first domain of unit cells;
    a second domain of unit cells;
    a third domain of unit cells; and
    wherein:
        the unit cells of the domains are collectively arranged in a lattice;
        each unit cell comprises:
            a topological-insulative material;
            a first piezoelectric patch; and
            a second piezoelectric patch; and
        a controller is configured to control the propagation of a wave through the lattice by:
            applying a negative capacitance to the first piezoelectric patches in the first domain;
            applying a negative capacitance to the second piezoelectric patches in the second domain; and
            alternatingly applying a negative capacitance to the first and second piezoelectric patches, respectively, of the third domain.

12. The multiplexer/demultiplexer of claim 11, wherein the controller comprises a negative capacitance circuit comprising;
    an operational amplifier;
    a first resistor;
    a second resistor in series with the first resistor; and
    a capacitor.

13. The multiplexer/demultiplexer of claim 11 further comprising:
    a first port positioned at an interface between the first and second domains;
    a second port positioned at an interface between the first and third domains; and
    a third port positioned at an interface between the second and third domains.

14. The multiplexer/demultiplexer of claim 13, wherein the multiplexer/demultiplexer is configured such that when a negative capacitance is applied to:
    the first piezoelectric patches in the first and third domains; and
    the second piezoelectric patches in the second domain;

waves propagate between the first port and the third port along topological domain walls.

15. The multiplexer/demultiplexer of claim 13, wherein the multiplexer/demultiplexer is configured such that when a negative capacitance is applied to:
   the first piezoelectric patches in the first domain; and
   the second piezoelectric patches in the second and third domains;
waves propagate between the first port and the second port along topological domain walls.

16. The multiplexer/demultiplexer of claim 13, wherein the first port is an input and the second and third ports are outputs, such that the multiplexer/demultiplexer is configured as a demultiplexer.

17. The multiplexer/demultiplexer of claim 13, wherein the first port is an output and the second and third ports are inputs, such that the multiplexer/demultiplexer is configured as a multiplexer.

18. The multiplexer/demultiplexer of claim 13, wherein:
   the lattice has a hexagonal shape; and
   the interfaces between the first, second, and third domains are separated by an angle of about 120 degrees.

19. The multiplexer/demultiplexer of claim 11, wherein each of the unit cells is configured such that an application of negative capacitance to one of the first and second piezoelectric patches causes a break in inversion symmetry of the respective unit cell.

* * * * *